United States Patent
Guo et al.

(10) Patent No.: US 12,268,040 B2
(45) Date of Patent: Apr. 1, 2025

(54) μLED LIGHT-EMITTING AND DISPLAY DEVICE WITH SINGLE-ENDED ELECTRICAL CONTACT AND SINGLE-ENDED CARRIER INJECTION, AND MANUFACTURING METHOD THEREFOR

(71) Applicants: FUZHOU UNIVERSITY, Fujian (CN); MINDU INNOVATION LAB, Fujian (CN)

(72) Inventors: Tailiang Guo, Fujian (CN); .Ye Liu, Fujian (CN); Chaoxing Wu, Fujian (CN); Dianlun Li, Fujian (CN); Yongai Zhang, Fujian (CN); Xiongtu Zhou, Fujian (CN); Kun Wang, Fujian (CN)

(73) Assignees: FUZHOU UNIVERSITY, Fuzhou (CN); MINDU INNOVATION LAB, Fujian (CN)

( * ) Notice: Subject to any disclaimer, the term of this patent is extended or adjusted under 35 U.S.C. 154(b) by 0 days.

(21) Appl. No.: 17/768,483

(22) PCT Filed: Aug. 31, 2020

(86) PCT No.: PCT/CN2020/112400
§ 371 (c)(1),
(2) Date: Apr. 13, 2022

(87) PCT Pub. No.: WO2021/073286
PCT Pub. Date: Apr. 22, 2021

(65) Prior Publication Data
US 2024/0297281 A1 Sep. 5, 2024

(30) Foreign Application Priority Data

Oct. 16, 2019 (CN) .......................... 201910984757.1

(51) Int. Cl.
*H01L 33/00* (2010.01)
*H01L 25/075* (2006.01)
(Continued)

(52) U.S. Cl.
CPC ....... *H10H 20/857* (2025.01); *H01L 25/0753* (2013.01); *H10H 20/0364* (2025.01)

(58) Field of Classification Search
CPC ................ H01L 33/62; H01L 25/0753; H01L 2933/0066; H01L 33/0093; H01L 33/0095;
(Continued)

(56) References Cited

U.S. PATENT DOCUMENTS

2016/0211245 A1* 7/2016 Do ..................... G02F 1/133603
2021/0296617 A1* 9/2021 Seo ..................... H10K 50/852

* cited by examiner

*Primary Examiner* — Theresa T Doan
(74) *Attorney, Agent, or Firm* — Jose Cherson Weissbrot

(57) ABSTRACT

The invention relates to a μLED light-emitting and display device with single-ended electrical contact and single-ended carrier injection, and a manufacturing method of the μLED light-emitting and display device. The μLED light-emitting and display device comprises more than one pixel unit, and each pixel unit sequentially comprises a lower pixel electrode, μLED chips, an insulating layer, and an upper pixel electrode from bottom to top, wherein the μLED chips directly contact with the lower pixel electrode, external carriers are injected into the μLED chips through the lower pixel electrode, the insulating layer prevents the external carriers from being injected into the μLED chips through the upper pixel electrode, and the μLED chips are lit by an alternating electric field applied between the upper pixel electrode and the lower pixel electrode. The invention avoids the complicated bonding process, and is expected to improve the market competitiveness of the μLED light-emitting and display device.

13 Claims, 3 Drawing Sheets

(51) Int. Cl.
*H10H 20/857* (2025.01)
*H10H 20/01* (2025.01)

(58) Field of Classification Search
CPC . H01L 33/32; H01L 2933/0016; H01L 33/42; H01L 33/44; H01L 33/005; H01L 33/38
USPC .......................................................... 257/89
See application file for complete search history.

μLED LIGHT-EMITTING AND DISPLAY DEVICE WITH SINGLE-ENDED ELECTRICAL CONTACT AND SINGLE-ENDED CARRIER INJECTION, AND MANUFACTURING METHOD THEREFOR

BACKGROUND OF THE INVENTION

Technical Field

The invention relates to the field of display and light-emitting device design, in particular to a μLED light-emitting and display device with single-ended electrical contact and single-ended carrier injection, and a manufacturing method thereof.

DESCRIPTION OF RELATED ART

In the technical field of flat panel display, μLED has many advantages, and the most notable advantage is low power consumption, high brightness, ultra-high definition, high color saturation, higher response speed, longer service life and higher work efficiency and the like. It is a new transformational display technology and is expected to replace almost all applications of TFT liquid crystal display in the field of flat panel display.

The current μLED production process follows a traditional LED manufacturing method, in which a pn junction grows on the base surface by various thin film growth methods and then is cut into micro-sized LED μLED chips. The μLED chips are transferred to a circuit substrate by various mechanical tools, and the accurate electrical contact between the μLED chips and a driving electrode needs to be achieved through accurate alignment and bonding, so the device manufacturing efficiency is low and the yield is low. In order to solve the above problems and improve the efficiency of the μLED industry, it is urgent to develop and design a new μLED.

BRIEF SUMMARY OF THE INVENTION

In view of this, the purpose of the present invention is to propose a μLED light-emitting and display device with single-ended electrical contact and single-ended carrier injection and a manufacturing method of the μLED light-emitting and display device, which avoids the complicated bonding process and is expected to improve the market competitiveness of the μLED light-emitting and display device.

The present invention is achieved using the following scheme: a μLED light-emitting and display device with single-ended electrical contact and single-ended carrier injection comprises more than one pixel unit, and each pixel unit sequentially comprises a lower pixel electrode, μLED chips, an insulating layer, and an upper pixel electrode from bottom to top, wherein the μLED chips directly contact with the lower pixel electrode, external carriers are injected into the μLED chips through the lower pixel electrode, the insulating layer prevents the external carriers from being injected into the μLED chips through the upper pixel electrode, and the μLED chips are lit by an alternating electric field applied between the upper pixel electrode and the lower pixel electrode.

Further, the μLED chips comprise a P-type semiconductor layer, a light-emitting layer and a N-type semiconductor layer, and the P-type semiconductor layer, the light-emitting layer and the N-type semiconductor layer are stacked to form a semiconductor junction capable of emitting light under the action of an electric field.

Further, the semiconductor junction in the to μLED chips comprises a single PN junction, a single heterojunction, a composite PN junction comprising a plurality of PN junctions, or a combined semiconductor junction comprising a PN junction and a heterojunction.

Further, the semiconductor junction is located on the surface or in the inside of the μLED chips.

Further, the p-type semiconductor layer has a thickness of 1 nm-2.0 μm, the light-emitting layer has a thickness of 1 nm-1.0 μm, and the n-type semiconductor layer has a thickness of 1 nm-2.5 μm.

Further, one or more than two μLED chip are present in each pixel unit.

Further, the size of the upper pixel electrode or the lower pixel electrode in a pixel unit is not smaller than the sum of the sizes of all the μLED chips in the pixel unit.

Further, the μLED chips have a size of 1 nm to 1000 μm and a thickness of 1 nm to 100 μm.

Further, at least one of the upper pixel electrode and the lower pixel electrode is a transparent electrode, so that the two sides of the device can be completely transparent, or one side of the device is transparent and the other side of the device is non-transparent, wherein the material of the transparent electrode comprises graphene, indium tin oxide, carbon nanotubes, silver nanowires, copper nanowires or a combination thereof, and the material of a non-transparent electrode comprises gold, silver, aluminum, copper or a combination thereof.

Further, wherein the material of the insulating layer has a light transmittance of greater than or equal to 80% in a visible light range, and the material is an organic insulating material, an inorganic insulating material, air or a combination thereof.

Further, the insulating layer has a thickness of 1 nm to 1000 μm.

Further, the waveform of the alternating electric field comprises sine wave, triangle wave, square wave, pulse or a combination thereof. The alternating electric field has a frequency of 1 Hz to 1000 M Hz.

Further, the μLED chips emit light (comprising infrared light or ultraviolet light) of different colors by selecting different semiconductor materials.

Further, the μLED chips can emit light of the same color or light of different mixed colors by using a composite PN junction or a combined semiconductor junction.

Further, the μLED light-emitting and display device is prepared on a rigid material comprising glass, ceramics and sapphire or prepared on a flexible material comprising PI.

The present invention also provides a manufacturing method of a μLED light-emitting and display device with single-ended electrical contact and single-ended carrier injection, comprising the following steps:

S1: preparing a lower pixel electrode array and a connection wire thereof on the surface of a base plate;

S2: disposing a patterned μLED array on the surface of the base plate of a substrate;

S3: providing an insulating layer on the surfaces of the μLED array, the lower pixel electrode array and a connection wire thereof using an insulating layer manufacturing process; and S4: preparing an upper pixel electrode array and a connection wire thereof on the surface of the insulating layer.

The operation of the μLED device is achieved by applying an AC driving signal to the upper pixel electrode array and the lower pixel electrode array.

Further, S2 specifically comprises: arranging μLED chips emitting light of different colors on the surface of the base plate of the substrate by means of inkjet printing, silk-screen printing, spin coating, brush coating, roll coating, chemical self-assembly, electromagnetic self-assembly and the like.

Further, S2 specifically comprises: disposing a patterned μLED array on the surface of the base plate of the substrate using an in-situ growth method.

Compared with the prior art, the present invention has the following beneficial effects: the μLED of the present invention utilizes electron-hole recombination to generate radiative transition, only single-ended electrical contact exists between the n-type semiconductor layer and p-type semiconductor layer of the μLED chips of the present invention and the external driving electrode and no bonding is required, which differs from a traditional μLED device. Therefore, the μLED device proposed by the present invention avoids the complicated bonding process, can shorten the manufacturing cycle of the μLED light-emitting and display screen and improve the yield, and is expected to greatly improve the market competitiveness of the μLED.

Figure 1:
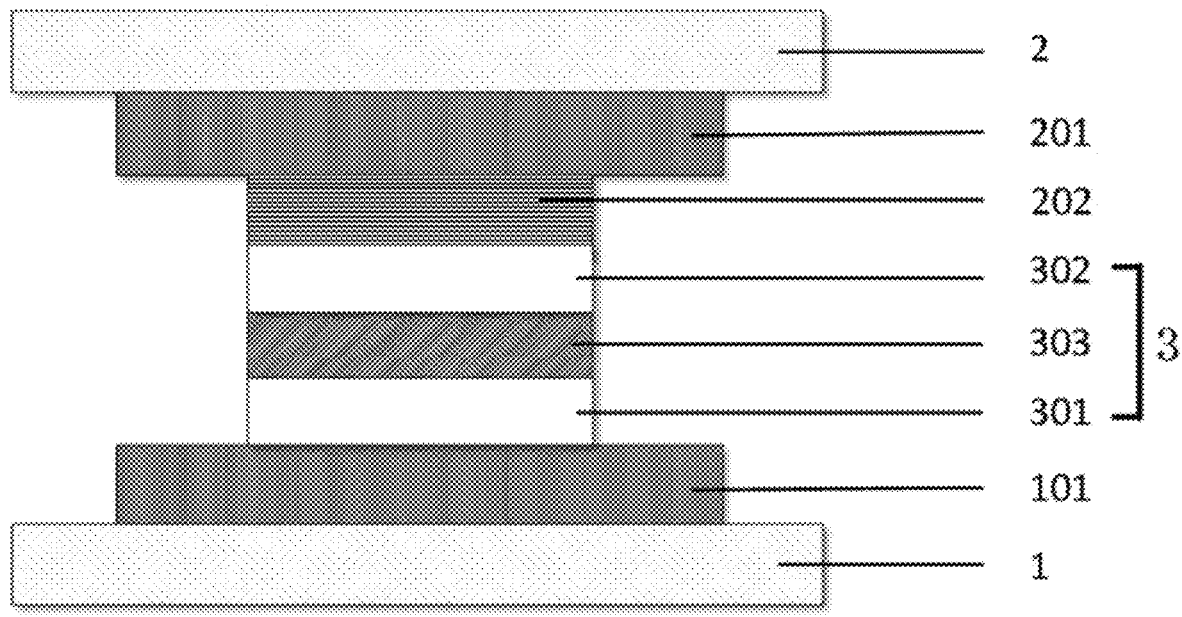
FIG. 1 is a cross-section structural diagram of a pixel unit of a μLED light-emitting device and display with single-ended electrical contact and single-ended carrier injection according to an embodiment of the present invention.

In the drawings, 1 is the lower base plate, 101 is the patterned lower pixel electrode arranged on the surface of the lower base plate, 102 is the injection electrode, 2 is the upper base plate, 201 is the patterned upper pixel electrode arranged on the surface of the upper base plate, 202 is the insulating layer, 3 is the μLED chips, 301 is the P-type semiconductor layer, 302 is the N-type semiconductor layer, 303 and 304 are light-emitting layers, and 305 is the P-type semiconductor layer.

DETAILED DESCRIPTION OF THE INVENTION

The present invention will be further described below with reference to the drawings and the embodiments.

It should be noted that the following detailed description is exemplary and intended to provide further explanation of the present application. Unless otherwise defined, all technical and scientific terms used herein have the same meanings as those commonly understood by those skilled in the art.

It should be noted that the terms used herein are only intended to describe specific embodiments, and not intended to limit the exemplary embodiments according to the present application. As used herein, unless it is clearly indicated otherwise in the context, the singular form is also intended to include the plural form. In addition, it should be understood that when the terms "comprises" and/or "comprising" are used in the present specification, they indicate the presence of features, steps, operations, devices, components and/or a combination thereof.

The present embodiment provides a μLED light-emitting and display device with single-ended electrical contact and single-ended carrier injection comprising more than one pixel unit, and each pixel unit sequentially comprises a lower pixel electrode, μLED chips, an insulating layer, and an upper pixel electrode from bottom to top, wherein the μLED chips directly contact with the lower pixel electrode, external carriers are injected into the μLED chips through the lower pixel electrode, the insulating layer prevents the external carriers from being injected into the μLED chips through the upper pixel electrode, and the μLED chips are lit by an alternating electric field applied between the upper pixel electrode and the lower pixel electrode.

In this embodiment, the μLED chips comprise a P-type semiconductor layer, a light-emitting layer and a N-type semiconductor layer, and the P-type semiconductor layer, the light-emitting layer and the N-type semiconductor layer are stacked to form a semiconductor junction capable of emitting light under the action of an electric field.

In this embodiment, the semiconductor junction in the μLED chips comprises a single PN junction, a single heterojunction, a composite PN junction comprising a plurality of PN junctions, or a combined semiconductor junction comprising a PN junction and a heterojunction.

In this embodiment, the semiconductor junction is located on the surface or in the inside of the μLED chips.

In this embodiment, the p-type semiconductor layer has a thickness of 1 nm-2.0 μm, the light-emitting layer has a thickness of 1 nm-1.0 μm, and the n-type semiconductor layer has a thickness of 1 nm-2.5 μm.

In this embodiment, one or more than two chips are present in each pixel unit.

In this embodiment, the size of the upper pixel electrode or the lower pixel electrode in a pixel unit is not smaller than the sum of the sizes of all the μLED chips in the pixel unit.

In this embodiment, the μLED chips have a size of 1 nm to 1000 μm and a thickness of 1 nm to 100 μm.

In this embodiment, at least one of the upper pixel electrode and the lower pixel electrode is a transparent electrode, so that the two sides of the device can be completely transparent, or one side of the device is transparent and the other side of the device is non-transparent, wherein the material of the transparent electrode comprises graphene, indium tin oxide, carbon nanotubes, silver nanowires, copper nanowires or a combination thereof, and the material of a non-transparent electrode comprises gold, silver, aluminum, copper or a combination thereof.

In this embodiment, the material of the insulating layer has a light transmittance of greater than or equal to 80% in a visible light range, and the material is an organic insulating material, an inorganic insulating material, air or a combination thereof.

In this embodiment, the insulating layer has a thickness of 1 nm to 1000 μm.

In this embodiment, the waveform of the alternating electric field comprises sine wave, triangle wave, square wave, pulse or a combination thereof. The alternating electric field has a frequency of 1 Hz to 1000 M Hz.

In this embodiment, the μLED chips emit light (comprising infrared light or ultraviolet light) of different colors by selecting different semiconductor materials.

In this embodiment, the μLED chips can emit light of the same color or light of different mixed colors by using a composite PN junction or a combined semiconductor junction.

In this embodiment, the μLED light-emitting and display device is prepared on a rigid material comprising glass, ceramics and sapphire or prepared on a flexible material comprising PI.

As shown in FIG. 1, FIG. 1 is a cross-section schematic diagram of a first pixel unit structure according to the present embodiment, wherein the μLED chips have a single semiconductor junction with a structure of p-type semiconductor material-multiple quantum well-n-type semiconductor material. The μLED3, e.g., a GaN-based LED formed by an epitaxial method, comprises a N-type doped GaN layer 302, a P-doped GaN layer 301 and a multiple-quantum-well light-emitting layer 303. The μLED3 has a plane size of 20 μm×20 μm.

The μLED3 is arranged on the surface of the lower pixel electrode 101, the insulating layer 202 is arranged on the surface of the μLED3, the upper pixel electrode 201 is arranged on the surface of the insulating layer 202, the upper pixel electrode is indium tin oxide, and the sizes of the lower pixel electrode 101 and the upper pixel electrode 201 are both 60 μm×60 μm.

The insulating layer 202 has a thickness of 100 nm, and the insulating layer 202 is aluminum oxide.

When an alternating current signal is applied between the lower pixel electrode 101 and the upper pixel electrode 201, the μLED3 can emit light.

Figure 2:
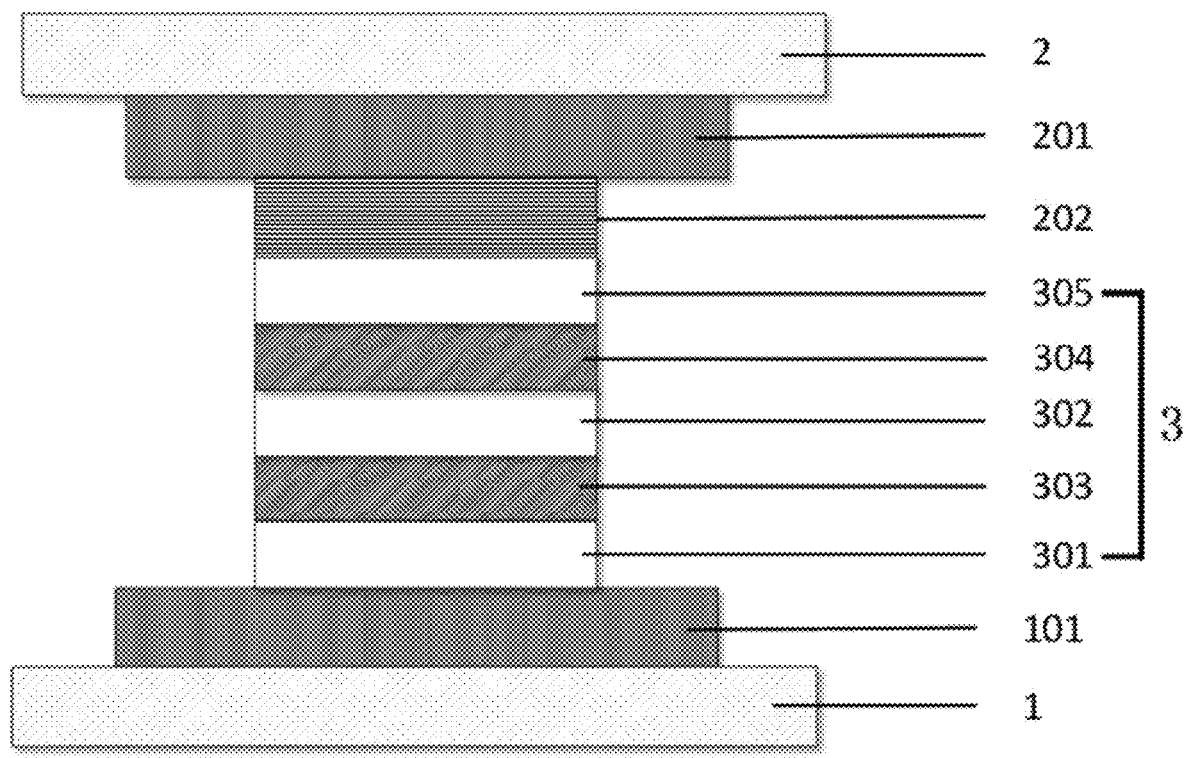
FIG. 2 is a cross-section structural diagram of a pixel unit of a μLED light-emitting and display device with single-ended electrical contact and single-ended carrier injection according to another embodiment of the present invention.

As shown in FIG. 2, FIG. 2 is a cross-section schematic diagram of a second pixel unit structure according to the present embodiment. The μLED chips have a compound semiconductor junction with a structure of p-type semiconductor material-multiple quantum well-n-type semiconductor material-multiple quantum well-p-type semiconductor material. The μLED3, e.g., a GaN-based LED which is formed by an epitaxial method and has a semiconductor junction structure, comprises: a P-doped GaN layer 305, a N-doped GaN layer 302, a P-doped GaN layer 301, and multiple-quantum-well light-emitting layers 303 and 304. The μLED3 has a plane size of 20 μm×20 μm.

The μLED3 is arranged on the surface of the lower pixel electrode 101, the insulating layer 202 is arranged on the surface of the μLED3, the upper pixel electrode 201 is arranged on the surface of the insulating layer 202, the upper pixel electrode is indium tin oxide, and the sizes of the lower pixel electrode 101 and the upper pixel electrode 201 are both 60 μm×60 μm.

The insulating layer 202 has a thickness of 100 nm, and the insulating layer 202 is aluminum oxide.

When an alternating current signal is applied between the lower pixel electrode 101 and the upper pixel electrode 201, the μLED3 can emit light.

The present embodiment also provides a manufacturing method of a μLED light-emitting and display device with single-ended electrical contact and single-ended carrier injection, comprising the following steps:

S1: preparing a lower pixel electrode array and a connection wire thereof on the surface of a base plate;

S2: disposing a patterned μLED chip array on the surface of the base plate of a substrate;

S3: providing an insulating layer on the surfaces of the μLED chip array, the lower pixel electrode array and a connection wire thereof using an insulating layer manufacturing process; and S4: preparing an upper pixel electrode array and a connection wire thereof on the surface of the insulating layer.

The operation of the μLED device is achieved by applying an AC driving signal to the upper pixel electrode array and the lower pixel electrode array.

In this embodiment, S2 specifically comprises: arranging μLED chips emitting light of different colors on the surface of the base plate of the substrate by means of inkjet printing, silk-screen printing, spin coating, brush coating, roll coating, chemical self-assembly, electromagnetic self-assembly and the like.

In this embodiment, S2 specifically comprises: disposing a patterned μLED chip array on the surface of the base plate of the substrate using an in-situ growth method.

Figure 3:
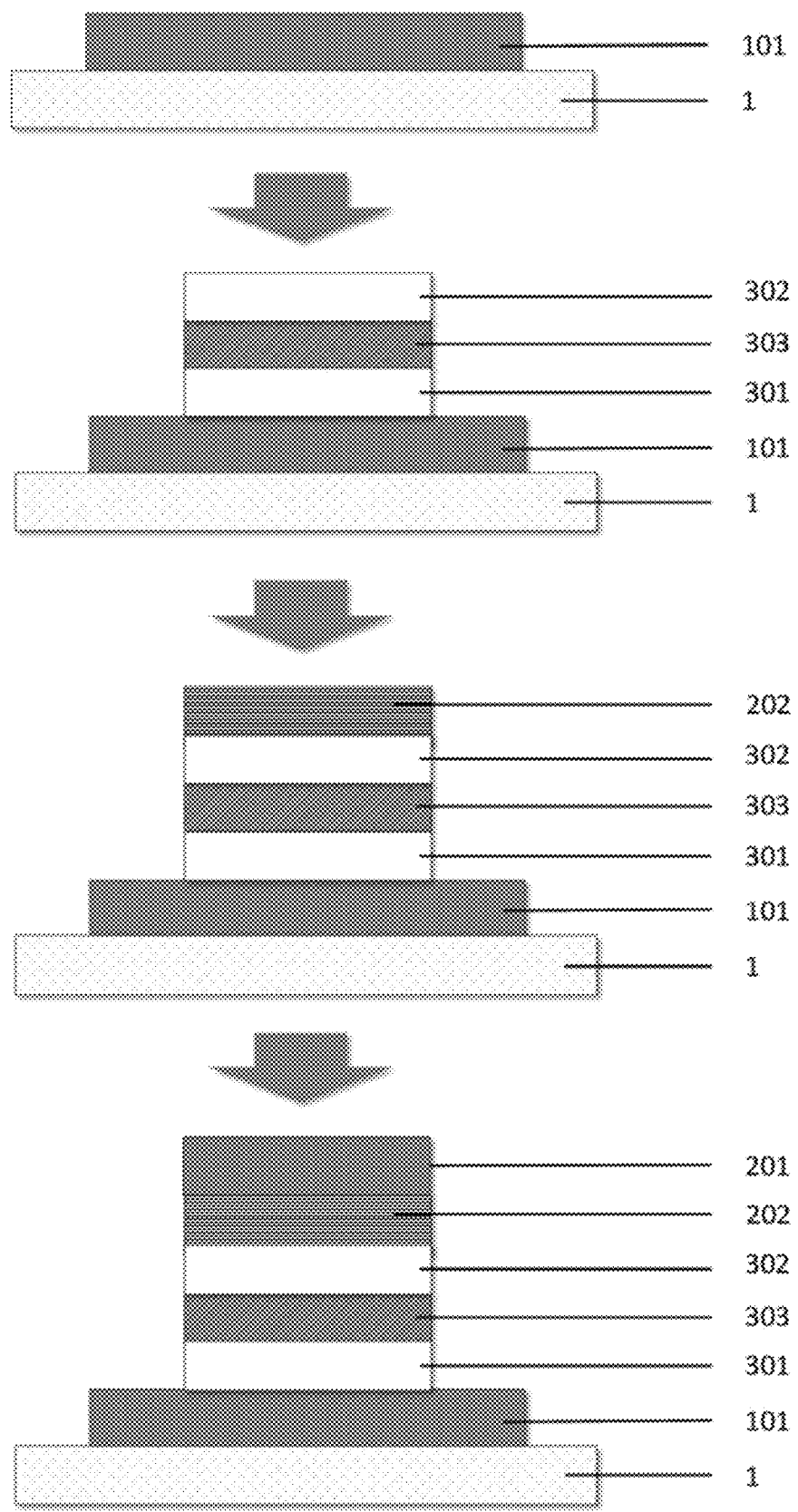
FIG. 3 is a schematic diagram of a manufacturing process of the pixel unit in FIG. 1.
Figure 4:
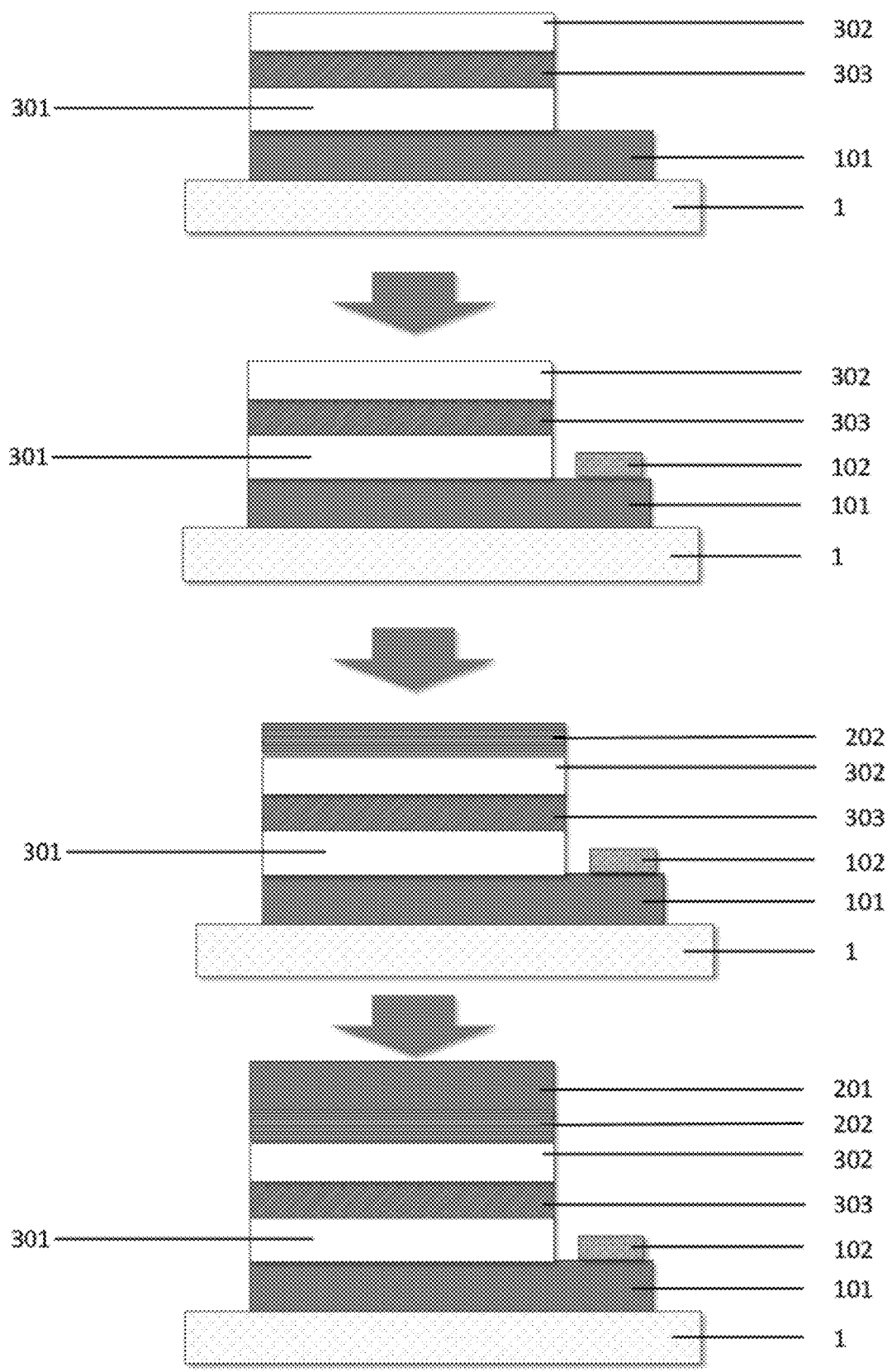
FIG. 4 is another pixel unit and a manufacturing process thereof according to an embodiment of the present invention.

In particular, specifically as shown in FIG. 3, FIG. 3 shows a device manufacturing method using the pixel unit of FIG. 1, wherein the μLED chips of the μLED light-emitting and display device are arranged on the surface of the lower base plate 1 by means of a transfer method, and the manufacturing method comprises the following steps:

(1) the μLED3 is, for example, a GaN-based LED which is formed by an epitaxial method and comprises a N-type doped GaN layer 302, a P-doped GaN layer 301 and a multiple-quantum-well light-emitting layer 303. Peeling is conducted to obtain self-supporting μLED chips. The μLED3 has a plane size of 20 μm×20 μm.

(2) A lower pixel electrode 101 array and a connection wire thereof are prepared on the surface of a lower base plate 1 by electron beam evaporation and lithography, the lower pixel electrode 101 is indium tin oxide, and the lower pixel electrode 101 has a size of 60 microns× 60 microns.

(3) The μLED3 is transferred to the surface of the lower pixel electrode 101 using a μLED array manufacturing technology.

Optionally, the μLED array manufacturing technology comprises inkjet printing, screen printing, spin coating, brush coating, roll coating, chemical self-assembly, electromagnetic self-assembly, and the like.

(4) An aluminum oxide insulating layer 202 is deposited on the surface of the base plate provided with a μLED3 array and a lower pixel electrode array by an atomic layer deposition process, and the insulating layer 202 has a thickness of 500 nm.

(5) The upper pixel electrode 201 array and a connection wire thereof are prepared on the surface of the insulating layer by electron beam evaporation and photolithography.

In particular, the present embodiment also provides another μLED light-emitting and display device with single-ended electrical contact and single-ended carrier injection, wherein the μLED chips are grown on the surface of the lower base plate 1 in situ, and the material of the lower base plate can be but not limited to sapphire, silicon, etc., wherein the μLED3 μLED chips are leaked out of a n-type GaN mesa, and the n-type GaN serves as the lower pixel electrode 101. The manufacturing method specifically comprises the following steps:

(1) a GaN-based μLED3 array is grown on the surface of the lower base plate 1 by an epitaxial method and photolithography, and comprises a N-doped GaN layer 302, a P-doped GaN layer 301 and a multiple-quantum-well light-emitting layer 303. The μLED3 has a plane size of 20 μm×20 μm. The μLED3 is leaked out of the n-type GaN mesa, and the n-type GaN serves as the lower pixel electrode 101;

(2) an injection electrode 102 is prepared on the surface of the lower base plate 1 by electron beam evaporation and photolithography, and the injection electrode 102 is electrically connected with the N-type GaN mesa (the lower pixel electrode).

(3) An aluminum oxide insulating layer 202 is deposited on the surface of the base plate provided with the μLED3 array and the injection electrode 102 by an atomic layer deposition process, and the insulating layer 202 has a thickness of 500 nm.

(4) The upper pixel electrode 201 array and a connection wire thereof are prepared on the surface of the insulating layer by electron beam evaporation and photolithography.

The above are only preferred embodiments of the present invention, and are not intended to limit the present invention in other forms. Any person skilled in the art may change or modify the technical content disclosed above into an equivalent embodiment with equivalent changes. However, any simple modifications, equivalent changes and modifications made to the above embodiments according to the technical essence of the present invention without departing from the content of the technical solution of the present invention still fall within the protection scope of the technical solution of the present invention.

What is claimed is:

1. A μLED light-emitting and display device with single-ended electrical contact and single-ended carrier injection, comprising more than one pixel unit, and each pixel unit sequentially comprising a lower pixel electrode, μLED chips, an insulating layer, and an upper pixel electrode from bottom to top, wherein the μLED chips directly contact with the lower pixel electrode, external carriers are injected into the μLED chips through the lower pixel electrode, the insulating layer prevents the external carriers from being injected into the μLED chips through the upper pixel electrode, and the μLED chips are lit by an alternating electric field applied between the upper pixel electrode and the lower pixel electrode;
   μLED chips comprise a P-type semiconductor layer, a light-emitting layer and a N-type semiconductor layer, and the P-type semiconductor layer, the light-emitting layer and the N-type semiconductor layer are stacked to form a semiconductor junction capable of emitting light under the action of an electric field;
   wherein the semiconductor junction in the μLED chips comprises a single PN junction, a single heterojunction, a composite PN junction comprising a plurality of PN junctions, or a combined semiconductor junction comprising a PN junction and a heterojunction;
   wherein the semiconductor junction is located on the surface or in the inside of the μLED chips.

2. The μLED light-emitting and display device with single-ended electrical contact and single-ended carrier injection according to claim 1, wherein the p-type semiconductor layer has a thickness of 1 nm-2.0 μm, the light-emitting layer has a thickness of 1 nm-1.0 μm, and the n-type semiconductor layer has a thickness of 1 nm-2.5 μm.

3. The μLED light-emitting and display device with single-ended electrical contact and single-ended carrier injection according to claim 1, wherein one or more than two μLED chips are present in each pixel unit.

4. The μLED light-emitting and display device with single-ended electrical contact and single-ended carrier injection according to claim 3, wherein the size of the upper pixel electrode or the lower pixel electrode in a pixel unit is not smaller than the sum of the sizes of all the μLED chips in the pixel unit.

5. The μLED light-emitting and display device with single-ended electrical contact and single-ended carrier injection according to claim 1, wherein the μLED chips have a size of 1 nm to 1000 μm and a thickness of 1 nm to 100 μm.

6. The μLED light-emitting and display device with single-ended electrical contact and single-ended carrier injection according to claim 1, wherein at least one of the upper pixel electrode and the lower pixel electrode is a transparent electrode, and wherein the material of the transparent electrode comprises graphene, indium tin oxide, carbon nanotubes, silver nanowires, copper nanowires or a combination thereof, and the material of a non-transparent electrode comprises gold, silver, aluminum, copper or a combination thereof.

7. The μLED light-emitting and display device with single-ended electrical contact and single-ended carrier injection according to claim 1, wherein the material of the insulating layer has a light transmittance of greater than or equal to 80% in a visible light range, and the material is an organic insulating material, an inorganic insulating material, air or a combination thereof.

8. The μLED light-emitting and display device with single-ended electrical contact and single-ended carrier injection according to claim 1, wherein the insulating layer has a thickness of 1 nm to 1000 μm.

9. The μLED light-emitting and display device with single-ended electrical contact and single-ended carrier injection according to claim 1, wherein the waveform of the alternating electric field comprises sine wave, triangle wave, square wave, pulse or a combination thereof.

10. The μLED light-emitting and display device with single-ended electrical contact and single-ended carrier injection according to claim 1, wherein the alternating electric field has a frequency of 1 Hz to 1000 MHz.

11. The μLED light-emitting and display device with single-ended electrical contact and single-ended carrier injection according to claim 1, wherein the μLED chips emit light (comprising infrared light or ultraviolet light) of different colors by selecting different semiconductor materials.

12. The μLED light-emitting and display device with single-ended electrical contact and single-ended carrier injection according to claim 1, wherein the μLED chips can emit light of the same color or light of different mixed colors by using a composite PN junction or a combined semiconductor junction.

13. The μLED light-emitting and display device with single-ended electrical contact and single-ended carrier injection according to claim 1, wherein the μLED light-emitting and display device is prepared on a rigid material comprising glass, ceramics and sapphire or prepared on a flexible material comprising PI.

* * * * *